(12) United States Patent
Longhurst et al.

(10) Patent No.: US 12,446,186 B2
(45) Date of Patent: Oct. 14, 2025

(54) NOZZLE ARRANGEMENT AND COOLING MODULE

(71) Applicant: ICEOTOPE GROUP LIMITED, Rotherham (GB)

(72) Inventors: Nathan Longhurst, Rotherham (GB); Jason Matteson, Raleigh, NC (US); David Amos, Sheffield (GB)

(73) Assignee: ICEOTOPE GROUP LIMITED, Rotherham (GB)

( * ) Notice: Subject to any disclaimer, the term of this patent is extended or adjusted under 35 U.S.C. 154(b) by 356 days.

(21) Appl. No.: 17/777,239

(22) PCT Filed: Nov. 18, 2020

(86) PCT No.: PCT/GB2020/052933
§ 371 (c)(1),
(2) Date: May 16, 2022

(87) PCT Pub. No.: WO2021/099772
PCT Pub. Date: May 27, 2021

(65) Prior Publication Data
US 2022/0400579 A1  Dec. 15, 2022

(30) Foreign Application Priority Data

Nov. 18, 2019 (GB) ..................... 1916763

(51) Int. Cl.
*H05K 7/20* (2006.01)

(52) U.S. Cl.
CPC ..... *H05K 7/20272* (2013.01); *H05K 7/20236* (2013.01); *H05K 7/2039* (2013.01); *H05K 7/20772* (2013.01)

(58) Field of Classification Search
CPC .......... H05K 7/20272; H05K 7/20236; H05K 7/2039; H05K 7/20772
(Continued)

(56) References Cited

U.S. PATENT DOCUMENTS 5,522,452 A * 6/1996 Mizuno ............... H01L 23/4336
165/286
6,973,801 B1  12/2005 Campbell et al.
(Continued)

FOREIGN PATENT DOCUMENTS

CN  101193708 A  6/2008
CN  108811472 A  11/2018
(Continued)

OTHER PUBLICATIONS

International Search Report and Written Opinion issued in App. No. PCT/GB2020/052933, mailing date Mar. 25, 2021, 19 pages.
(Continued)

*Primary Examiner* — Zhengfu J Feng
(74) *Attorney, Agent, or Firm* — Bochner PLLC; Andrew Bochner

(57) ABSTRACT

A nozzle arrangement for cooling an electronic component. The nozzle arrangement comprises: a nozzle for discharging liquid coolant; and a mount configured to disperse the liquid coolant, the mount further configured to be coupled with the electronic component. The nozzle is coupled to the mount such that, in use, the liquid coolant is discharged from the nozzle through the mount and dispersed by the mount.

16 Claims, 7 Drawing Sheets

(58) Field of Classification Search
USPC .................................................. 361/679.47
See application file for complete search history.

(56) References Cited

U.S. PATENT DOCUMENTS

| | | | |
|---|---|---|---|
| 2002/0159232 A1* | 10/2002 | Beitelmal | G06F 1/20 |
| | | | 361/695 |
| 2004/0264124 A1 | 12/2004 | Patel | |
| 2005/0210906 A1 | 9/2005 | Laufer et al. | |
| 2006/0250774 A1 | 11/2006 | Campbell et al. | |
| 2008/0037221 A1* | 2/2008 | Campbell | H01L 23/4735 |
| | | | 361/699 |
| 2009/0260777 A1 | 10/2009 | Attlesey | |
| 2010/0103620 A1* | 4/2010 | Campbell | H05K 7/20772 |
| | | | 361/702 |
| 2012/0063091 A1* | 3/2012 | Dede | H05K 7/20927 |
| | | | 174/15.1 |
| 2012/0170222 A1* | 7/2012 | Dede | F28F 3/083 |
| | | | 165/173 |
| 2014/0085823 A1* | 3/2014 | Campbell | H05K 7/20 |
| | | | 361/689 |
| 2014/0198456 A1* | 7/2014 | Bose | H05K 7/2039 |
| | | | 361/720 |
| 2014/0284787 A1 | 9/2014 | Joshi | |
| 2017/0181326 A1 | 6/2017 | Shelnutt et al. | |

FOREIGN PATENT DOCUMENTS

| | | | | |
|---|---|---|---|---|
| EP | 0560478 A1 | 9/1993 | | |
| EP | 2151863 A1 | 2/2010 | | |
| GB | 2571054 A | 8/2019 | | |
| GB | 2571054 B | * 3/2020 | ........... | H01L 23/367 |
| JP | H05251600 A | 9/1993 | | |
| JP | H05275587 A | 10/1993 | | |
| WO | 2019018597 A1 | 1/2019 | | |
| WO | 2019048864 A1 | 3/2019 | | |

OTHER PUBLICATIONS

Communication under Rule 71(3) EPC of the European Patent Office in related European Patent Appl. No. 20812406.5, dated Mar. 20, 2025, 31 pages.

Office Action of the China Patent Office in related Chinese Appl. No. 202080079806.8, dated Jun. 21, 2025, 18 pages.

* cited by examiner

NOZZLE ARRANGEMENT AND COOLING MODULE

TECHNICAL FIELD

The disclosure concerns a nozzle arrangement and a cooling module.

BACKGROUND

Many types of electrical/electronic component generate heat during operation. In particular, electrical computer components such as motherboards, central processing units (CPUs), and memory modules may dissipate substantial amounts of heat when in use. Heating of the electrical components to high temperatures can cause damage, affect performance or cause a safety hazard. Accordingly, substantial efforts have been undertaken to find efficient, high performance systems for cooling electrical components effectively and safely.

To date, cooling of electrical components has typically been achieved through air cooling, for example via fans. However, it is difficult to achieve even cooling of electrical components through the use of air cooling. Furthermore, the recent increased performance of heat generating components has meant that it is difficult to provide sufficient cooling via air cooling, which limits the peak performance of such devices.

A further type of cooling system uses liquid cooling. Although different liquid cooling assemblies have been demonstrated, in general the electrical components are immersed in a coolant liquid so as to provide a large surface area for heat exchange between the heat generating electrical components and the coolant.

SUMMARY

Against this background, there is provided a nozzle arrangement in accordance with claim 1. There is further provided a cooling module in accordance with claim 15. Further features of the invention are detailed in the dependent claims and herein. Features of a method corresponding with those of the nozzle arrangement and the cooling module may additionally be provided.

According to the present disclosure, there is provided a nozzle arrangement for cooling an electronic component, comprising: a nozzle for discharging liquid coolant; and a mount configured to disperse the liquid coolant, the mount further configured to be coupled with the electronic component; wherein the nozzle is coupled to the mount such that, in use, the liquid coolant is discharged from the nozzle through the mount and dispersed by the mount.

Preferably, the mount is configured for, in use, discharging the liquid coolant onto the electronic component.

Preferably, the mount is configured for, in use, dispersing the liquid coolant over a surface of the electronic component.

Preferably, the mount comprises an aperture for discharging liquid coolant.

Preferably, the mount comprises a plurality of grooves for dispersing liquid coolant.

Preferably, the plurality of grooves diverge from the aperture.

Preferably, the mount is configured to be coupled directly with the electronic component.

Preferably, the mount is configured to be releasably coupled with the electronic component.

Preferably, the mount is configured to be coupled with the electronic component via a snap-fit connection.

Preferably, the mount comprises two or more resilient flanges, a distal end of each resilient flange comprising a hook.

Preferably, the mount is a unitary element.

Preferably, the mount comprises integral attachment means for attaching the mount to the electronic component.

Preferably, the nozzle is configured to be coupled to the mount via a push-fit connection.

Preferably, the nozzle may comprise a tubular protrusion for coupling with the aperture of the mount.

According to the present disclosure, there is further provided an apparatus comprising a nozzle arrangement according to the present disclosure and an electronic component.

According to the present disclosure, there is further provided a method for discharging liquid coolant from a nozzle arrangement according to the present disclosure onto an electronic component.

According to the present disclosure, there is further provided a cooling module comprising: a container housing a plurality of heat generating components, the heat generating components comprising one or more low temperature components, median temperature components, and high temperature components; and a nozzle arrangement for directing liquid coolant onto a median temperature component.

Preferably, the low temperature components generate a low heat output relative to the other components in the cooling module, the high temperature components generate a high heat output relative to the other components in the cooling module, and the median temperature components generate a medium heat output relative to the other components in the cooling module.

Preferably, the nozzle arrangement is configured to direct liquid coolant to the hottest part of a heat transmitting surface of the median temperature component.

Preferably, the cooling module further comprises: a pump configured to cause liquid coolant to flow within the container; and at least one pipe, arranged to transport liquid coolant from the pump to the nozzle arrangement; wherein the nozzle arrangement comprises a nozzle, wherein the nozzle is configured to push-fit couple to a respective end of the at least one pipe.

Preferably, the nozzle arrangement is a nozzle arrangement according to the present disclosure.

Preferably, the cooling module further comprises a heat sink mounted on or around a high temperature component, the heat sink comprising a volume defined by a base and a retaining wall, and a nozzle for directing liquid coolant into the volume.

Preferably, the cooling module further comprises a level of liquid coolant in the container for at least partially immersing the one or more low temperature components.

Preferably, the level of liquid coolant in the volume is higher than the level of liquid coolant in the container.

Preferably, the cooling module further comprises: a component mounted away from a base of the container; and a nozzle arrangement for directing liquid coolant onto the component. Preferably, the nozzle arrangement is according to the present disclosure.

Preferably, the liquid coolant is a primary liquid coolant, the cooling module further comprising a heat exchanger configured to receive a secondary liquid coolant and to transfer heat from the primary liquid coolant to the secondary liquid coolant.

Preferably, the one or more median temperature components comprise one of a solid state drive, an input/output device, or a power supply unit.

BRIEF DESCRIPTION OF THE DRAWINGS

The invention may be put into practice in a number of ways and preferred embodiments will now be described by way of example only and with reference to the accompanying drawings, in which.

DETAILED DESCRIPTION OF PREFERRED EMBODIMENTS

Figure 1:
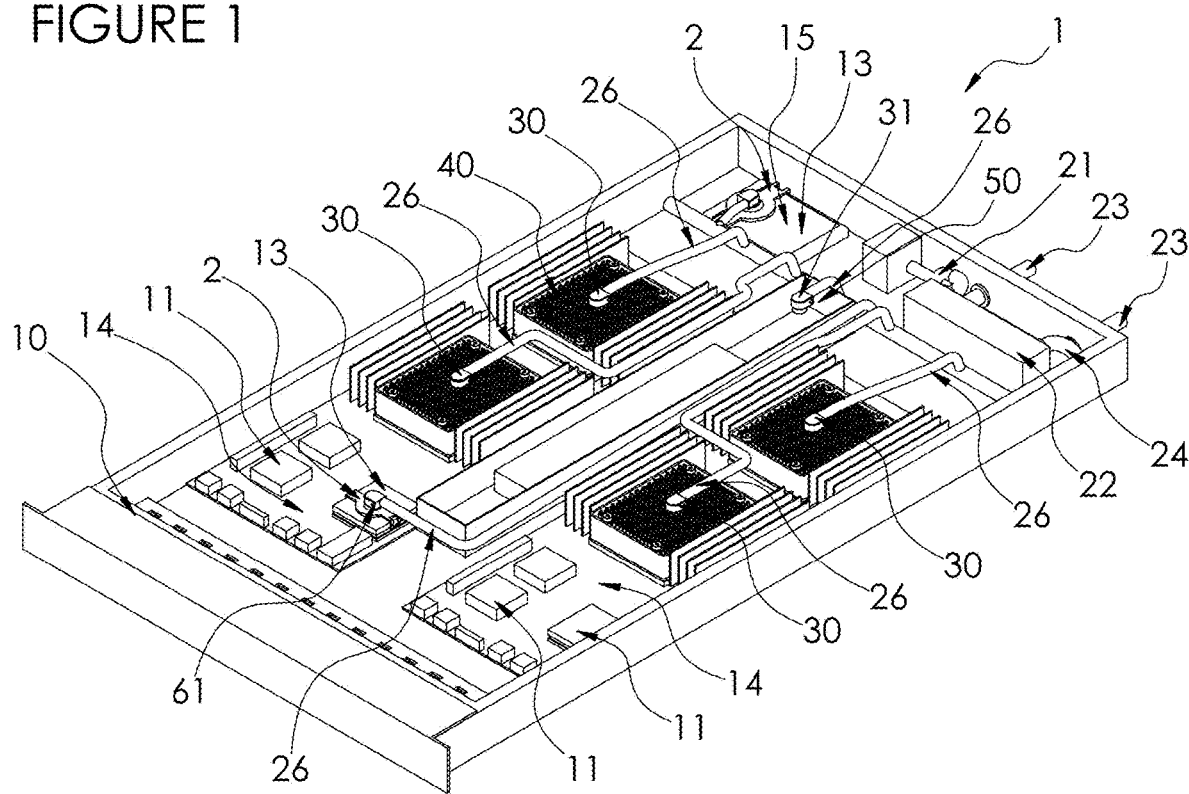
FIG. 1 shows an isometric view of a cooling module according to the present disclosure, comprising a nozzle arrangement according to the present disclosure.
Figure 2:
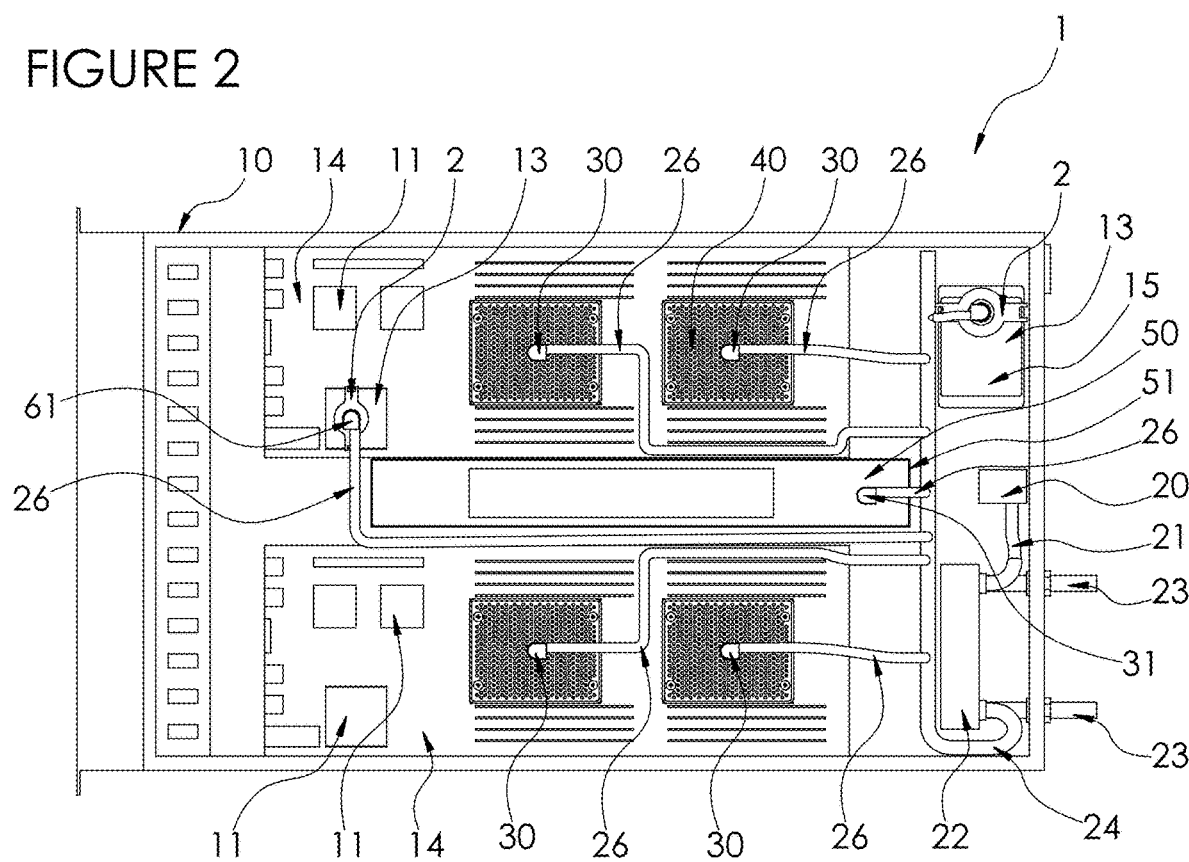
FIG. 2 shows a plan view of the cooling module of FIG. 1.

With reference to FIGS. 1 and 2, there is shown a cooling module 1 according to the present disclosure, comprising a nozzle arrangement 2 in accordance with the present disclosure. Also to be considered is FIG. 3, in which there is depicted an exploded view of the cooling module 1 of FIGS. 1 and 2. The cooling module 1 may, for example, comprise a server blade assembly.

The cooling module 1 comprises a container 10 (shown without a lid), housing a plurality of electrical/electronic components. (The terms electrical and electronic are used analogously herein.) The components may generate heat during operation. The components within the cooling module 1 may include components 11 generating a relatively low temperature, components 12 generating a relatively high temperature, and components 13 generating a relatively median temperature. The absolute heat output of each category of component is not relevant to the present disclosure. What is relevant is the heat output of each component relative to the other components in the cooling module 1. Low temperature components 11 will fall towards the bottom of a range determined by the levels of heat generated by all of the components in the cooling module 1, high temperature components 12 will fall towards the top of the range, and median temperature components 13 will fall towards the middle of the range. Median temperature components 13 may include, but are not limited to, solid state drives (SSDs) 15, input/output devices, and power supply units.

Figure 3:
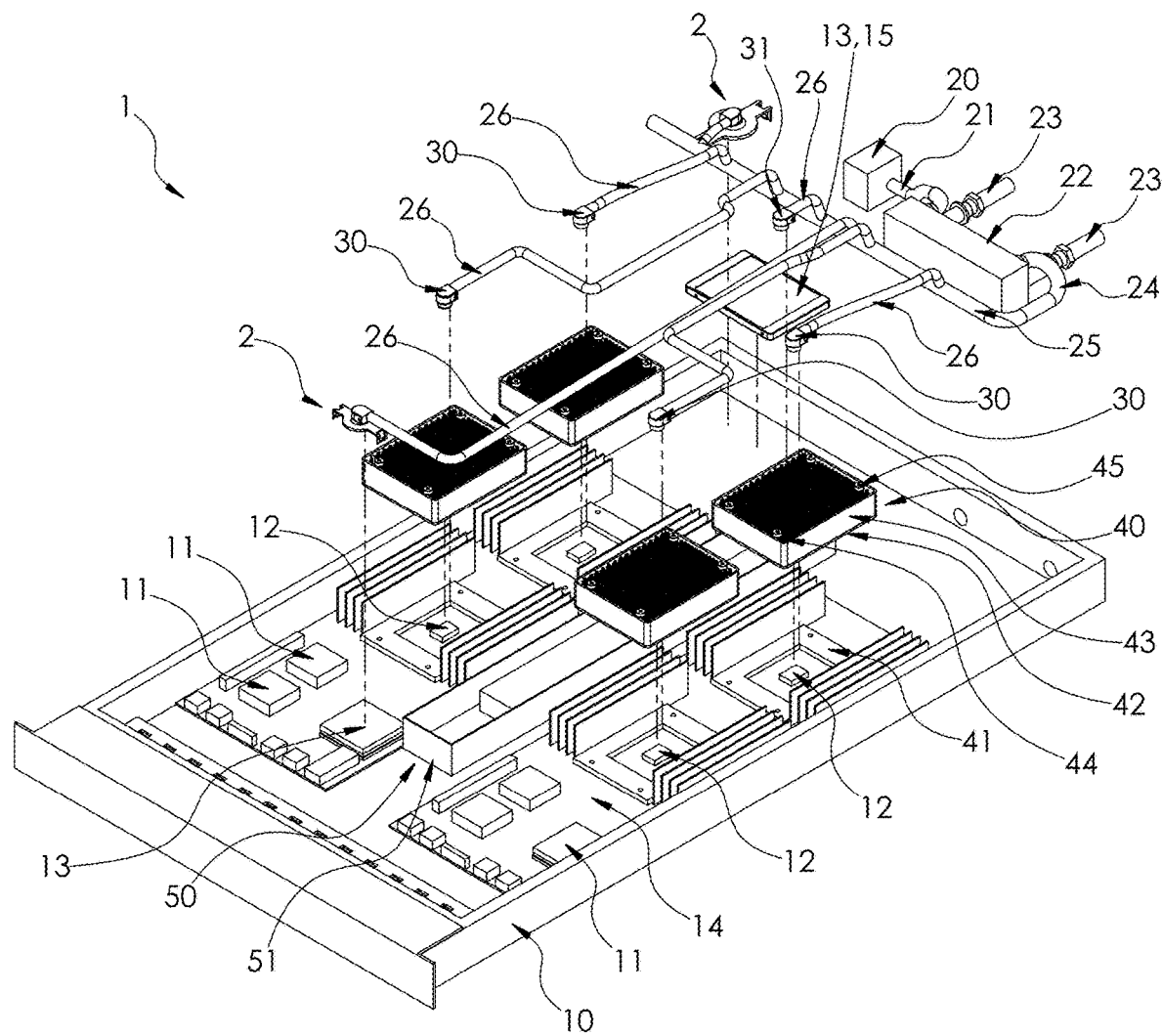
FIG. 3 shows an exploded isometric view of the cooling module of FIGS. 1 and 2.

Some low temperature components 11, high temperature components 12, and median temperature components 13 are mounted on a circuit board 14, which may be a computer motherboard. In FIGS. 1 to 3, two such identical circuit boards 14 are shown within the container 10.

The container 10 is, in operation, filled with a dielectric liquid coolant (not shown), which may be termed a primary coolant. The liquid coolant is not electrically conductive, but is normally thermally conductive and can carry heat by conduction and/or convection. The quantity of liquid coolant inside the container 10 (which will be referred to as the 'container coolant') is sufficient to cover or immerse the low temperature components 11 at least partially, but it may not necessarily fully immerse the low temperature components 11. The level of liquid coolant used in operation is discussed below. A pump 20 causes liquid coolant to flow through pipe 21 and travel to a heat exchanger 22. The heat exchanger 22 receives a secondary liquid coolant (typically water or water-based) and transfers heat from the liquid coolant within the container 10 to this secondary liquid coolant. The secondary liquid coolant is provided to and emerges from the heat exchanger 22 via interface connections 23. The pump 20 causes the cooled primary liquid coolant to exit the heat exchanger 22 through pipe 24 to a coolant manifold 25, from which it is directed through further pipes 26 to emerge through nozzles 30, 31, and 60.

The cooling module 1 is typically a rack-mounted module, and the components within the container 10 are preferably at least part of a computer server circuitry, for instance comprising a motherboard and associated components. The cooling module 1 may therefore have a height of 1 rack unit (1U, corresponding with 44.45 mm) or an integer number of rack units. The cooling module 1 may be configured for installation or installed in a corresponding rack, housing multiple such cooling modules (one, some, or all of which may have different internal construction from cooling module 1 disclosed herein). In this configuration, the secondary liquid coolant may be shared between cooling modules in a series or parallel arrangement. A plenum chamber and/or manifold may be provided in the rack to allow this. Other components may be provided in the rack for efficient and safe (such as power regulators, one or more pumps or similar devices).

First heat sinks 40 may be mounted on the high temperature components 12 (visible in FIG. 3). Each heat sink 40 may comprise: a base made up of a mount 41 and a planar substrate 42 fixed to the mount 41; a retaining wall 43 attached to the planar substrate 42; projections 44 (shown in the form of pins); and fixing screws 45, which attach the substrate 42 to the mount 41. In this way, the planar substrate 42 sits directly on the high temperature component 12 and transfers heat from the high temperature component 12 to a volume defined by a base (the planar substrate 42) and the retaining wall 43, in which the projections 44 are provided.

The liquid coolant is delivered to each first heat sink 40 via a nozzle 30. The nozzle 30 is arranged to direct coolant perpendicular to the plane of the substrate 42. This forces the jet or flow of the liquid coolant directly into the volume defined by the substrate 42 and retaining wall 43 of the first heat sink 40. As a consequence, heat dissipation is improved. This is especially the case in comparison with a system where the coolant is directed to flow over the heat sink, in a direction parallel to the plane of the heat sink substrate, such as in an air cooled system.

The nozzle 30 delivers the coolant directly in the centre of the volume defined by substrate 42 and retaining wall 43. In this example, the centre of that volume corresponds with the hottest part of the area of the substrate 42, which is adjacent to (and directly on) the high temperature component 12. This provides a contraflow, such that the coldest coolant is directed to contact the hottest area of each first heat sink 30. The coolant moves out radially from the hottest part, towards the retaining wall 43. Sufficient coolant is pumped via nozzle 30 into the volume such that it overflows the retaining wall 43 and collects with the container coolant.

The retaining wall 43 acting as a side wall enables different levels of coolant. The coolant within the volume of each first heat sink 30 is at a relatively high level, whereas the coolant in the container 10, which at least partially immerses the low temperature components 11, is at a lower level. This allows significantly less liquid coolant to be used than in other similar systems that cover all components at the same height.

A number of benefits are thereby realised. Firstly, since less dielectric coolant is being used and this coolant can be expensive, costs can be significantly reduced. Dielectric liquid coolants are typically very heavy. By using less liquid coolant, the cooling module 1 can be more straightforward to install and/or lift. Also, installing the cooling module 1 can require less infrastructure. In addition, the cooling module 1 is easier to handle than similar systems using significantly more primary liquid coolant. The level of the primary liquid coolant within the majority of the container 10 is not close to the top of the container. As a result, spillages during maintenance or exchange of components are less likely. The risk of leakage is also reduced.

The retaining wall 43 creates a weir effect. The coolant in the container 10 at a relatively low level cools the low temperature components 10 that, in the absence of a liquid coolant, would usually be cooled by air. It is not necessary for low temperature components 10 to be fully immersed in liquid coolant.

A second heat sink 50 may be provided to cool a power supply unit. The second heat sink 50 may comprise a volume defined by a base (not shown) and a retaining wall 51 as per the first heat sink, with a nozzle 31 discharging liquid coolant into the volume. The second heat sink 50 may therefore result in a similar weir effect, with liquid coolant overflowing the retaining wall 51 and collecting with the container coolant.

The median temperature components 13 require a lesser degree of cooling than the high temperature components 12, and therefore may not warrant the additional cost, complexity, and space associated with a first or second heat sink 40,50. Nevertheless, as median temperature components 13 generate more heat than low temperature components 11, it would be advantageous to provide the median temperature components 13 with a greater degree of cooling than is achieved through immersive cooling alone. Additional cooling may be provided to one of more of the median temperature components 13 by discharging liquid coolant directly onto the respective medium temperature components 13.

Figure 4:
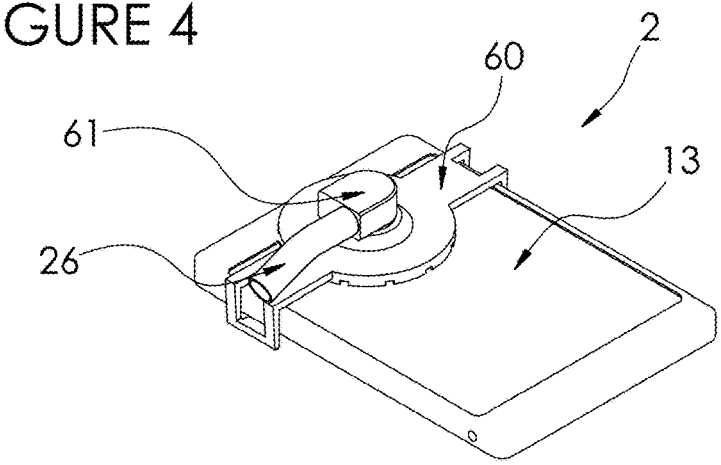
FIG. 4 shows an isometric view of a nozzle arrangement according to the present disclosure coupled to a component.
Figure 5:
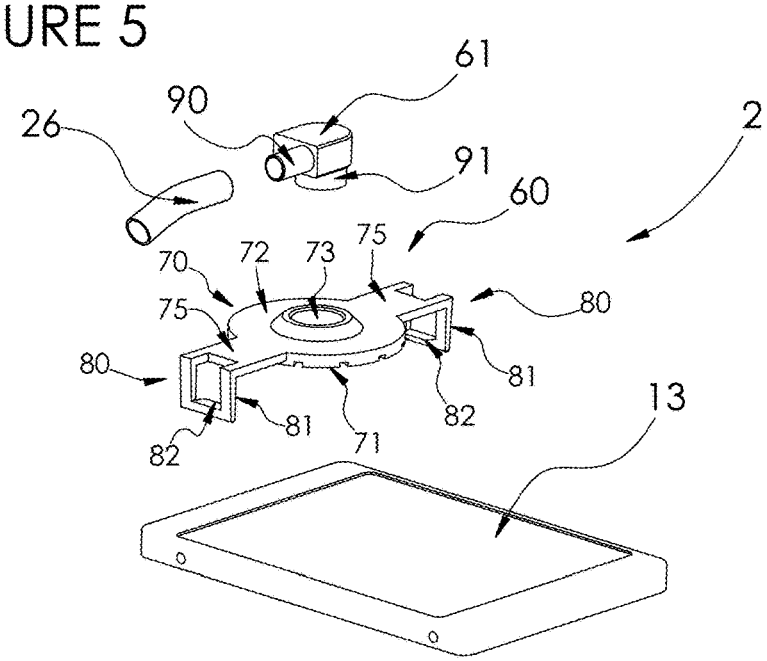
FIG. 5 shows an exploded view of the nozzle arrangement and component of FIG. 4.
Figure 6:
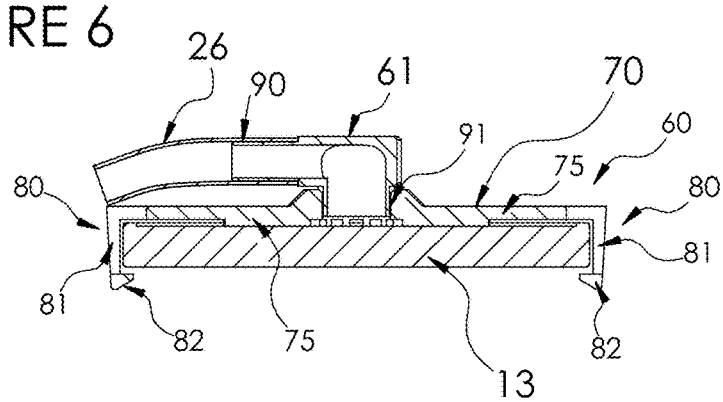
FIG. 6 shows a cross-sectional view side of the nozzle arrangement and component of FIGS. 4 and 5.

A nozzle arrangement 2 as illustrated in FIGS. 4 to 6 may be used to direct liquid coolant onto a median temperature component 13. The nozzle arrangement 2 may generally comprise a nozzle mount 60 (shown in further detail in FIGS. 10 to 13) coupled to a nozzle 61.

The nozzle mount 60 may comprise a generally planar element 70 having a first side 71 and an opposing second side 72. An aperture 73 may be provided in the planar element 70, through which liquid coolant may be discharged. The first side 71 of the planar element 70 may comprise dispersing means for dispersing liquid coolant discharged through the aperture 73. For example, the first side of the planar element 70 may be provided with a plurality of grooves 74 diverging from the aperture 73.

Two or more arms 75 may extend from generally opposing edges of the planar element 70. The arms 75 may extend generally parallel to the plane of the planar element 70. The arms 75 may have first and second sides 71,72 in common with the first and second sides 71,72 of the planar element 70.

The nozzle mount 60 may further comprise attachment means 80 for attaching the nozzle mount 60 to a median temperature component 13. Preferably, the mount may comprise integral attachment means 80, such that the nozzle mount 60 is a unitary element. Preferably, the attachment means 80 may be configured to provide a releasable attachment to a median temperature component 13. In particular, the attachment means 80 may be configured to provide a snap-fit connection. For example, a resilient flange 81 may extend from a distal end of each arm 75. The resilient flange 81 may extend from the first side 71 of the arm 75, in a direction generally perpendicular to the plane of the planar element 70. A distal end of each flange 81 may be provided with a hook 82, which may extend from the flange 81 in a direction generally parallel to the arm 75, towards a proximal end of the arm 75.

The sizing of the nozzle mount 60 may be bespoke to each median temperature component 13, to ensure a good fit. Alternatively, the nozzle mount 60 may be adjustable, for example by making the arms 75 telescopic.

The nozzle 61 may be configured to be releasably coupled to the pipe 26, to provide a supply of liquid coolant to the nozzle 61. This may be via a push-fit connection. For example, a first tubular protrusion 90 extending from the nozzle 61 may be configured to fit inside the pipe 26, as shown in FIGS. 4 to 6. Alternatively, the first tubular protrusion 90 may be configured such that the pipe 26 fits inside the first tubular protrusion 90.

The nozzle 61 may further be configured to be releasably coupled to the nozzle mount 60, such as via a push-fit connection. For example, a second tubular protrusion 91 extending from the nozzle 61 may be configured to provide a push-fit connection when inserted into the aperture 73 in nozzle mount 60. In an alternative embodiment, the nozzle 61 may be permanently coupled to the nozzle mount 60. For example, the nozzle 61 and the nozzle mount 60 may be formed as a unitary part.

The nozzle arrangement 2 enables the liquid coolant to be delivered directly to a median temperature component 13. Additionally, the nozzle arrangement enables the liquid coolant to be delivered to a localised area of the median temperature component 13. The positioning of the nozzle mount 60 on a surface of the median temperature component 13 may be optimised such that the aperture 73 is located over an area of the median temperature component 13 having the maximum heat generation. Such optimisation of the positioning of the nozzle mount 60 may advantageously increase the efficiently of the cooling provided by the nozzle arrangement 2.

Some components in the cooling module 1 may be mounted away from a base of the container 10 (not shown), for example mounted higher up on a circuit board or mounted on a mezzanine circuit board. The location of such components may mean that they cannot be cooled by immersive cooling in the container coolant. Instead, the nozzle arrangement 2 may advantageously be employed to cool such components.

By utilising push- and snap-fit connections, which do not require tools, the nozzle arrangement 2 may be fitted and removed straightforwardly. Consequently, replacing a circuit board 14 (which may comprise one or more median temperature components 13) or other median temperature components 13 in the cooling module 1 may be easy and quick. The nozzle 61 may further be provided with an earth point 4, which can be coupled to an earth or ground point, to eliminate static build up in the pipe 5 and nozzle 2.

To assemble the nozzle arrangement 2, the nozzle 61 may be coupled to the pipe 21 by inserting the first tubular protrusion 90 into the pipe 21 and may further be coupled to the nozzle mount 60 by inserting the second tubular protrusion 91 of the nozzle 61 into the aperture 73 of the nozzle mount 60.

Figure 7:
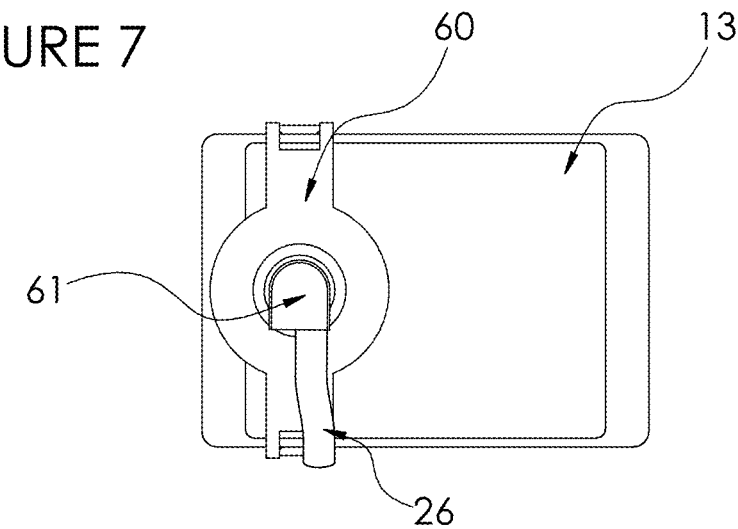
FIGS. 7 to 9 show three exemplary placements for the nozzle arrangement of FIGS. 4 to 6.
Figure 8:
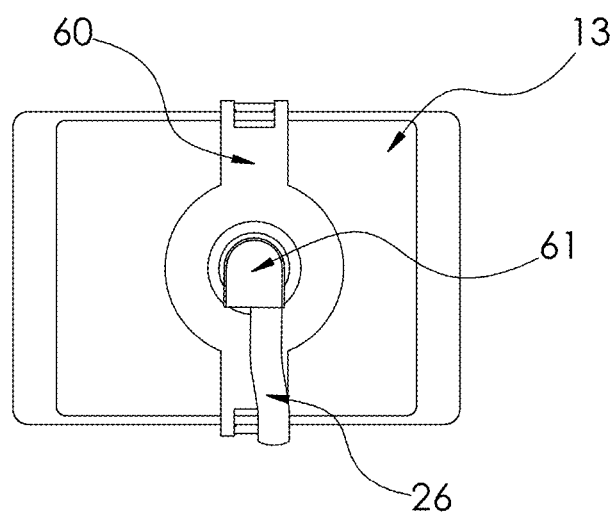
Figure 9:
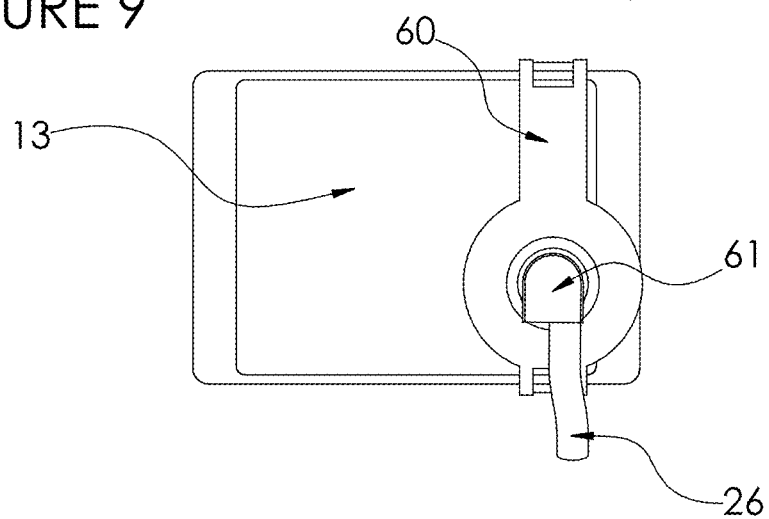
Figure 10:
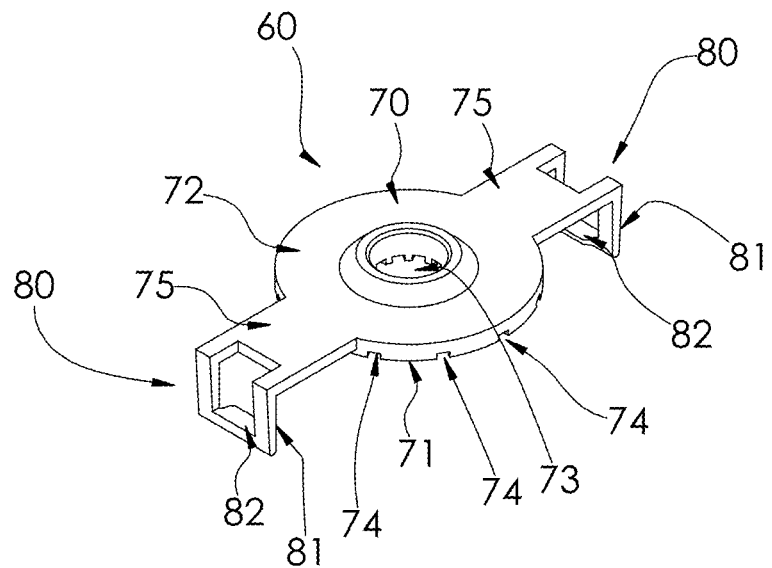
FIG. 10 shows an isometric view of a mount for a nozzle arrangement according to the present disclosure.
Figure 11:
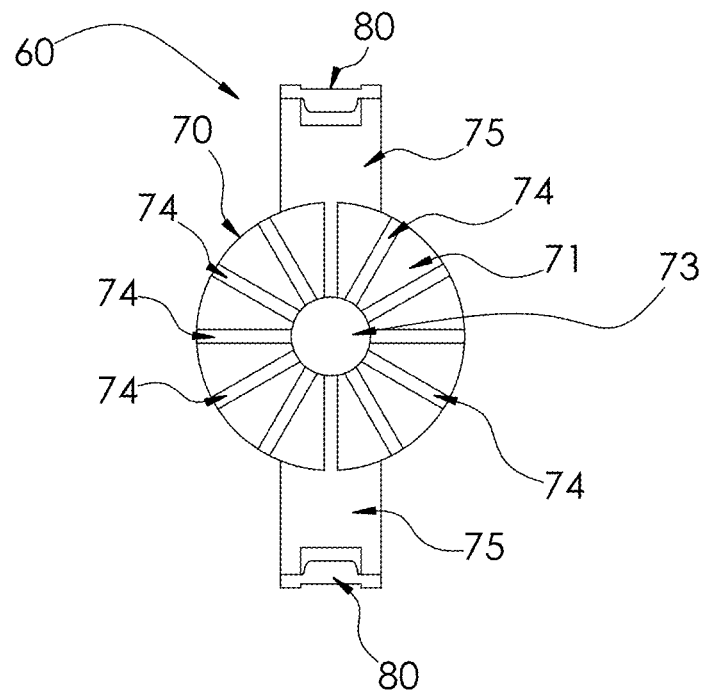
FIG. 11 shows a bottom plan view of the mount of FIG. 10.
Figure 12:
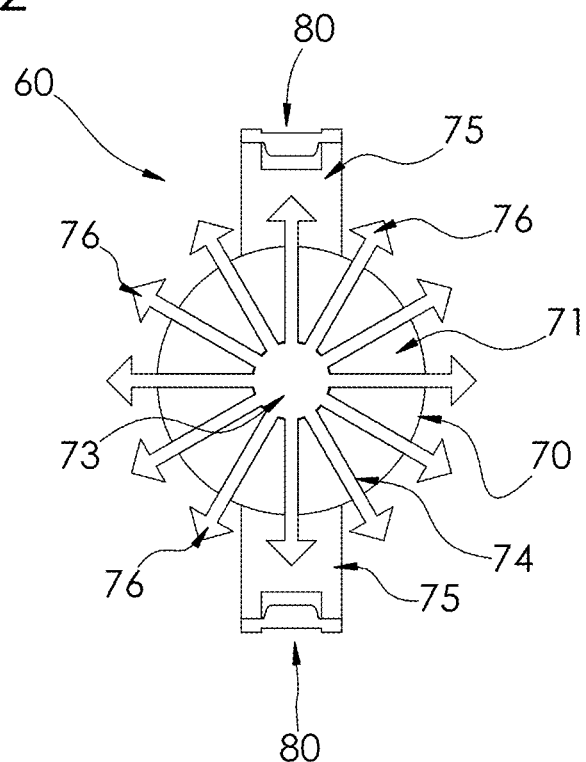
FIG. 12 shows the bottom plan view of FIG. 11, with directional arrows indicating a path taken by a liquid coolant.
Figure 13:
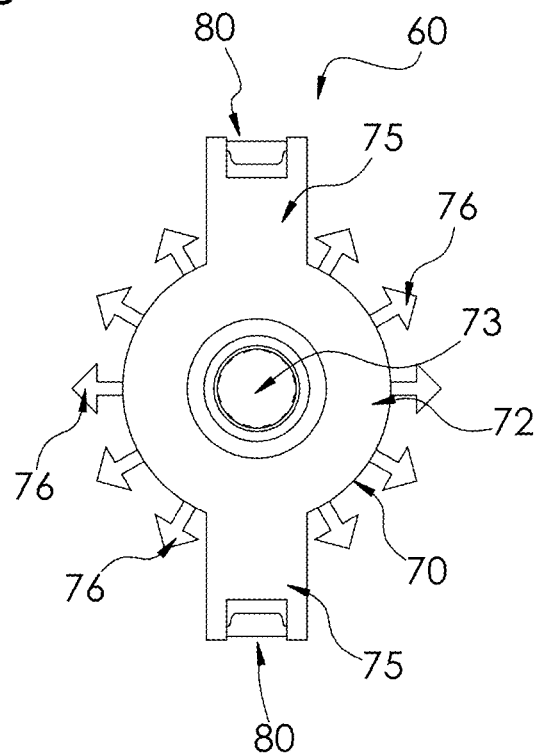
FIG. 13 shows a top plan view of FIG. 12.

Nozzle arrangements 2 may be coupled respectively to selected median temperature components 13 in a cooling module 1. In particular, the nozzle mount 60 of the nozzle arrangement 2 may be directly coupled to the median temperature component 13 via the attachment means 80. The positioning of the nozzle mount 60 on a surface of the median temperature component 13 may be optimised such that the aperture 73 of the nozzle mount 60 is located over an area of the surface of the median temperature component 13 which generates the most heat. Examples of positions of the nozzle mount 60 on a median temperature component 13 are shown in FIGS. 7 to 9.

In operation, the pump 20 may draw liquid coolant from the container 10 and drive it through the heat exchanger 22, via coolant manifold 25, to pipes 26, from which it may be discharged by respective nozzles 30,31,60. Nozzles 30,31 may discharge liquid coolant into first and second heat sinks 40,50 to cool high temperature components 12. Liquid coolant overflowing the heat sinks 40,50 may collect with the container coolant, which may be used to cool low temperature components 11 via immersive cooling.

Nozzles 61 may discharge liquid coolant directly onto the median temperature component 13. In particular, due to the positioning of the nozzle mount 60 on the median temperature component 13, liquid coolant may be discharged onto the hottest region of the surface of the median temperature component 13. Liquid coolant discharged through the nozzle 61 may be dispersed over the surface of the median temperature component 13 by the plurality of grooves 74 diverging from the aperture 73 on the first side 71 of the planar element 70. The resulting flow path of the liquid coolant is shown by arrows 76 in FIGS. 12 and 13. The dispersed liquid coolant may cascade over the edges of the median temperature component 13 and collect with the container coolant.

In this manner, the nozzle arrangement 2 enables additional directed cooling to be provided to selected median temperature components 13. Furthermore, the liquid coolant may be directed to the hottest region of a median temperature component 13, whilst also being evenly dispersed over the surface of the median temperature component 13. Cooling median temperature components 13 in this manner may increase the utility efficiently and economic efficiency of the coolant system.

The invention claimed is:

1. A nozzle device comprising:
a nozzle for discharging liquid coolant; and
a mount configured to disperse the liquid coolant, the mount further configured to be coupled with an electronic component;
wherein the nozzle is coupled to the mount such that, in use, the liquid coolant is discharged from the nozzle through the mount and dispersed by the mount;
a container housing a plurality of heat generating components, the heat generating components comprising one or more low temperature components, median temperature components, and high temperature components;
wherein the nozzle is configured to direct the liquid coolant onto a median temperature component;
a heat sink mounted on or around a high temperature component, the heat sink comprising a volume defined by a base and a retaining wall, and the nozzle for directing the liquid coolant into the volume, and
a level of liquid coolant in the container for at least partially immersing the one or more low temperature components, wherein the level of liquid coolant in the volume is higher than the level of liquid coolant in the container.

2. The nozzle device according to claim 1, wherein the mount is configured for, in use, discharging the liquid coolant onto the electronic component.

3. The nozzle device according to claim 1, wherein the mount is configured for, in use, dispersing the liquid coolant over a surface of the electronic component.

4. The nozzle device according to claim 1, wherein the mount comprises an aperture for discharging the liquid coolant.

5. The nozzle device according to claim 1, wherein the mount comprises a plurality of grooves for dispersing the liquid coolant.

6. The nozzle device according to claim 5, wherein the mount comprises an aperture for discharging the liquid coolant and wherein the plurality of grooves diverge from the aperture.

7. The nozzle device according to claim 1, wherein the mount is configured to be coupled directly with the electronic component or wherein the mount is configured to be releasably coupled with the electronic component.

8. The nozzle device according to claim 1, wherein the mount is configured to be coupled with the electronic component via a snap-fit connection.

9. The nozzle device according to claim 8, wherein the mount comprises two or more resilient flanges, a distal end of each resilient flange comprising a hook.

10. The nozzle device according to claim 1, wherein the mount is a unitary element or wherein the mount comprises integral attachment means for attaching the mount to the electronic component or wherein the nozzle is configured to be coupled to the mount via a push-fit connection.

11. The nozzle device according to claim 4, wherein the nozzle may comprise a tubular protrusion for coupling with the aperture of the mount.

12. The nozzle device according to claim 1, wherein the low temperature components generate a low heat output relative to the other components in a cooling module, the high temperature components generate a high heat output relative to the other components in the cooling module, and the median temperature components generate a medium heat output relative to the other components in the cooling module.

13. The nozzle device according to claim 1, wherein a nozzle arrangement is configured to direct liquid coolant to a hottest part of a heat transmitting surface of the median temperature component.

14. The nozzle device according to claim 1, further comprising:
a pump configured to cause liquid coolant to flow within the container, and
at least one pipe, arranged to transport liquid coolant from the pump to a nozzle arrangement; wherein the nozzle arrangement comprises the nozzle, wherein the nozzle is configured to push-fit couple to a respective end of the at least one pipe.

15. The nozzle device according to claim 1, further comprising:
a component mounted away from a base of the container; and
a nozzle arrangement for directing the liquid coolant onto the component.

16. The nozzle device according to claim 1, wherein the liquid coolant is a primary liquid coolant, a cooling module further comprising a heat exchanger configured to receive a secondary liquid coolant and to transfer heat from the primary liquid coolant to the secondary liquid coolant or wherein the one or more median temperature components comprise one of a solid state drive, an input/output device, or a power supply unit.

* * * * *